US006618283B2

United States Patent
Lin

(10) Patent No.: US 6,618,283 B2
(45) Date of Patent: Sep. 9, 2003

(54) SYSTEM AND METHOD FOR SKEW COMPENSATING A CLOCK SIGNAL AND FOR CAPTURING A DIGITAL SIGNAL USING THE SKEW COMPENSATED CLOCK SIGNAL

(75) Inventor: Feng Lin, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/944,484

(22) Filed: Aug. 29, 2001

(65) Prior Publication Data
US 2003/0043615 A1 Mar. 6, 2003

(51) Int. Cl.⁷ .............................. H03L 7/00; H03L 7/06
(52) U.S. Cl. ...................... 365/141; 365/155; 365/158; 365/161
(58) Field of Search ................................. 327/141, 155, 327/158, 159, 161

(56) References Cited

U.S. PATENT DOCUMENTS

| 5,087,829 A | * | 2/1992 | Ishibashi et al. ............ 327/158 |
| 5,295,164 A | * | 3/1994 | Yamamura .................. 327/159 |
| 5,355,037 A | * | 10/1994 | Andresen et al. ............ 327/158 |
| 5,544,203 A | | 8/1996 | Casasanta et al. .......... 375/376 |
| 5,757,218 A | | 5/1998 | Blum .......................... 327/175 |
| 5,838,179 A | | 11/1998 | Schmidt ...................... 327/156 |
| 6,011,732 A | | 1/2000 | Harrison et al. ............ 365/194 |
| 6,026,050 A | | 2/2000 | Baker et al. ................ 365/233 |
| 6,157,229 A | * | 12/2000 | Yoshikawa .................. 327/158 |
| 6,229,360 B1 | | 5/2001 | Mizuno et al. ............. 327/141 |
| 6,262,921 B1 | | 7/2001 | Manning .................... 365/194 |
| 6,275,555 B1 | | 8/2001 | Song .......................... 375/375 |
| 6,323,705 B1 | | 11/2001 | Shieh et al. ................ 327/158 |
| 6,342,796 B2 | * | 1/2002 | Jung .......................... 327/141 |
| 6,346,838 B1 | * | 2/2002 | Hwang et al. ............. 327/158 |
| 6,501,311 B2 | | 12/2002 | Lutkemeyer ................ 327/161 |

OTHER PUBLICATIONS

Takanori Saeki et al., "A Direct–Skew–Detect Synchronous Mirror Delay for Application–Specific Integrated Circuits," IEEE Journal of Solid–State Circuits, vol. 34, No. 3, pp. 372–378, Mar. 1999.*
Lin, Feng et al., "A Register–Controlled Symmetrical DLL for Double–Data–Rate DRAM," IEEE Journal of Solid State Circuits, vol. 34, No. 4, Apr. 1999, pp. 565–567.

* cited by examiner

*Primary Examiner*—Trong Phan
(74) *Attorney, Agent, or Firm*—Dorsey & Whitney LLP

(57) ABSTRACT

A synchronized mirror delay circuit is used to generate an internal clock signal from an external clock signal applied to the synchronized mirror delay. The internal clock signal is then coupled through a clock tree, and a feedback signal is generated that is indicative of the propagation delay of the internal clock signal through the clock tree. The feedback signal is applied to the synchronized mirror delay to allow the synchronized mirror delay to delay the internal clock signal by a delay interval that compensates for the propagation delay in the clock tree. A lock detector may be used to initially generate the internal clock signal directly from the external clock signal. A fine delay circuit that delays the internal clock signal in relatively fine increments may be used to couple the internal clock signal to the clock tree.

8 Claims, 4 Drawing Sheets

SYSTEM AND METHOD FOR SKEW COMPENSATING A CLOCK SIGNAL AND FOR CAPTURING A DIGITAL SIGNAL USING THE SKEW COMPENSATED CLOCK SIGNAL

TECHNICAL FIELD

This invention relates to electronic devices that are operated in synchronism with a clock signal, and more particularly to a system and method for compensating for variations in the propagation delay of clock signals in comparison to the propagation delay of other signals.

BACKGROUND OF THE INVENTION

The operating speed of electronic devices, such as memory devices, can often be increased by synchronizing the operation of the device to a clock signal. By operating the device synchronously, the timing at which various function occur in the device can be precisely controlled thereby allowing the speed at which these functions are performed to be increased by simply increasing the frequency or speed of the clock signal. However, as the speeds of clock signals has continued to increase with advances in semiconductor fabrication techniques, the propagation delays of clock signals within integrated circuit devices have become a problem. More specifically, internal clock signals are often generated from an external clock signal applied to the integrated circuit device. These internal clock signals are coupled throughout the integrated circuit device to control the timing of a variety of circuits. The times required for the internal clock signals to propagate to these circuits is difficult to either control or predict. As clock speeds continue to increase, the unpredictable and/or uncontrolled variations in internal clock signal propagation times can cause internal clock signals to be applied to circuits either too early or too late to allow the circuits to properly perform their intended functions. This problem, known as "clock skew," threatens to limit the speed at which integrated circuit devices can function.

Various solutions have been proposed to address this clock skew problems. Some of these solutions are described in Takanori Saeki et al., "A Direct-Skew-Detect Synchronous Mirror Delay for Application-Specific Integrated Circuits," *IEEE Journal of Solid-State Circuits*, Vol. 34, No. 3, March 1999. The article by Takanori Saeki et al. describes both open-loop and closed-loop clock skew compensation approaches. Closed-loop approaches include the use of phase-locked loops ("PLL") and delay-locked loops ("DLL") to synchronize the phase or timing of an internal clock signal to the phase or timing of an external clock signal used to generate the internal clock signal. These closed-loop approaches use a feedback signal to indicate the timing variations within the device. A phase comparator, such as a phase detector, is required to compare the phase or timing of the feedback signal to the phase or timing of a reference signal. Unfortunately, a significant amount of time may be required to achieve lock of the PLL or DLL.

Open-loop designs described in the Takanori Saeki et al. article include synchronized mirror delay ("SMD") circuits and clock synchronized delay ("CSD") circuits. CSD circuits generally include a variable delay line, usually a series of inverters, and latch circuits for selecting the output of one of these inverters as the delay line output. An internal clock signal is applied to the CSD circuit, and the magnitude of the delay provided by the CSD circuit is controlled in an attempt to set the phase or timing at which the internal clock signal is applied to an internal circuit. SMD circuits are basically the same as CSD circuits except that CSD circuits require the use of latches to store information. On the other hand, SMD circuits require specially shaped input clock signals. In order to generate internal clock signals on both the rising and falling edges of a clock signal (i.e., double data rate operation), SMD circuits, but not CSD circuits, require two variable delay lines, one for the clock signal and one for its compliment. In view of the similarity of CSD circuits and SMD circuits, they will be generically referred to herein as CSD/SMD circuits.

A conventional CSD/SMD circuit 10 described in the Takanori Saeki et al. article is shown in FIG. 1. An external clock signal XCLK is applied to an input buffer 12, and the output of the buffer 12 is applied to a delay model circuit 14. The output of the delay model circuit 14 is coupled through a measurement delay line to set a delay of a variable delay line 20. The delay of both the measurement delay line 16 and the variable delay line 20 is set to integer multiples of a clock period of the external clock signal less the delay of the delay model circuit 14, i.e., $n*tCLK-d_{mdl}$, where n is an integer, tCLK is the period of the XCLK signal, and $d_{mdl}$ is the delay of the delay model circuit 14. The variable delay line 20 outputs a clock signal to a clock driver 24. The clock driver 24 then outputs an internal clock signal ICLK to an internal clock line 28. The internal clock line 28 is coupled to a number of internal circuits 32 through respective circuit paths, which are collectively known as a "clock tree" 36.

The external clock signal XCLK is coupled through the input buffer 12 with a delay of $d_1$, through the measurement delay line 16 with a delay of $d_2$, through the variable delay line 20 with a delay of $d_3$, and through the clock driver 24 with a delay of $d_4$. For the phase of the internal clock signal ICLK to be synchronized to the phase of the external clock signal XCLK before the CSD/SMD circuit 10 has been locked, the sum of these delays, i.e., $d_1+d_{mdl}+d_2+d_3+d_4$, should be equal to integer multiples of one period tCLK of the external clock signal XCLK.

In operation, the delay $d_3$ of the variable delay line 20 is set in a conventional manner so that it is equal to the delay of the measurement delay line 16. The delay $d_2$ of the measurement delay line 16 is set by conventional means to the difference between integer multiples of the period tCLK of the external clock signal XCLK and the delay $d_{mdl}$ of the delay model circuit 14, i.e., $d_2=n*tCLK-d_{mdl}$. Thus, after one clock period tCLK, the delay $d_3$ of the variable delay line 20 has been determined. The total delay from the input of the input buffer 12 to the internal clock line 28 is given by the equation: $d_1+d_3+d_4$. The delay $d_{mdl}$ of the delay model circuit 14 is set to the sum of the delay $d_1$ of the input buffer 14 and the delay $d_4$ of the clock driver 24. This can be accomplished by implementing the delay model circuit 14 with a "dummy" input buffer 42 and a "dummy" clock driver 44. The dummy input buffer 42 is preferably identical to the input buffer 12 and thus also provides a delay of $d_1$. Similarly, the dummy clock driver 44 is preferably identical to the clock driver 24 and thus also produces a delay of $d_4$. Using the equation $d_3=d_2=n*tCLK-d_{mdl}$, the above equation $d_1+d_3+d_4$ for the total delay can be rewritten as: $d_1+n*tCLK-d_{mdl}+d_4$. Combining this last equation and the equation $d_{mdl}=d_1+d_4$ allows the equation for the total delay from the input of the input buffer 12 to the ICKL line 28 to be rewritten as: $d_1+n*tCLK-d_1-d_4+d_4$. This last equation can be reduced to simply $n*tCLK$, or 1 clock period of the external clock signal XCLK, assuming the delay of the delay model circuit 14 is less than a period of the external clock signal, i.e., $d_{mdl}<tCLK$. Thus, by using the delay model circuit 14 to model the delay $d_1$ of the input buffer 12 and the delay $d_4$ of the clock driver 24, the phase of the internal clock signal ICLK can be synchronized to the phase of the external clock signal XCLK. Moreover, the total lock time, including the delay through the delay model circuit 14 and the measurement delay line 16, is equal to $d_1+d_{mdl}+d_2+d_3+d_4$, which can be reduced to $2n*tCLK$. Therefore, this phase matching of the ICLK signal can be accomplished after only two periods of the external clock XCLK signal so that the integer "n" may be set equal to one.

Although the SMD/CSD circuit 10 shown in FIG. 1 can properly synchronize the phase of the internal clock signal ICLK to the phase of the external clock signal XCLK, it does so only at the internal clock line 28. The SMD/CSD circuit 10 does not compensate for propagation delays in the clock tree 36 used to couple the internal clock signal ICLK from the internal clock line 28 to the internal circuits 32.

An SMD/CSD circuit 48 somewhat similar to the SMD/CSD circuit 10 can be used in a clock skew compensation circuit 50 as shown in FIG. 2 to compensate for propagation delays in a clock tree. The SMD/CSD circuit 48 is shown as being used to generate an internal clock signal from an external clock signal XCLK that is used to latch an external data signal DATA in a latch 52. The external data signal is coupled to the latch through a data input buffer 56 having a delay of $d_1$. The external clock signal XCLK is applied to an input buffer 60 having a delay of $d_2$, and the output of the input buffer 60 is applied through a delay model circuit 62 to a measurement delay line 64. The delay model circuit 62 has a delay of $d_{mdl}$, and the measurement delay line 64 has a delay of $d_3$. The output of the input buffer 60 is also applied to a variable delay line 70 that is controlled so that it has the same delay $d_3$ as the measurement delay line 64, as previously explained. The output of the variable delay line 70 is applied to a clock driver 74 having a delay of $d_4$. Finally, the internal clock signal has a propagation delay of $d_5$ as it is coupled through a clock tree 78 from the clock driver 74 to the clock input of the latch 52.

The total delay from the input of the input buffer 60 to the clock input of the latch 52 is thus given by the equation: $d_2+d_3+d_4+d_5$ after the delay of the variable variable delay line 70 is determined. For the internal clock signal to enable the latch 52 to capture the data signal, the total delay should be reduced by the delay $d_1$ of the DATA signal propagating through the data input buffer 56. The timing relationship between the XCLK signal and the DATA signal as they are applied to the latch 52 will then be the same as the timing relationship between the XCLK signal and the DATA signal as they are externally received. The XCLK signal is coupled to the latch with a total delay of: $d_2+d_3+d_4+d_5$. Substituting $d_3=[n*tCLK-d_{mdl}]$ in the above equation yields for the total delay: $d_2+[n*tCLK-d_{mdl}]+d_4+d_5$. If the delay model circuit 62 models not only the delays of the input buffers 56, 60 and the clock driver 74, but also the delay $d_5$ of the clock tree 78, the delay of the delay model circuit 62 is given by the formula: $d_{mdl}=d_2-d_1+d_4+d_5$. The above equation for the total delay can then be expressed as: $d_2+[n*tCLK-d_2+d_1-d_4-d_5]+d_4+d_5$. This equation can be reduced to simply $n*tCLK+d_1$, or n periods of the XCLK signal plus the delay of the DATA signal through the input buffer 56. Letting n=1, the XCLK signal will thus be applied to the latch 52 one clock periods after the DATA signal is applied to the latch 52 so that the XCLK and DATA signals will have the same timing relationship at the latch 52 as the XCLK and DATA signals have at the external input terminals. To calculate the time for the SMD/CSD circuit 48 to achieve lock, the total delay time should be increased by the delay $d_{mdl}$ of the delay model circuit 62 and the delay $d_3$ of the measurement delay line 64. Thus, the total time to achieve lock is $d_2+d_{mdl}+(n*tCLK-d_{mdl})+(n*tCLK-d_{mdl})+d4+d5$, which, for n=1 and $d_{mdl}<tCLK$, can be reduced using the formula $d_{mdl}=d_2-d_1+d_4+d_5$ to $2*tCLK+d_1$.

The clock skew compensation circuits 50 improves the operation of synchronous digital circuits by attempting to compensate for propagation delays in a clock tree 78 coupled to a latch 52. As explained above, the circuit 50 attempts to compensate for clock tree propagation delays by attempting to model the propagation delay of the clock tree 78. However, it is significantly more difficult to model the propagation delay of the clock tree 78 compared to modeling the propagation delay of other circuits, such as the input buffers 56, 60 and the clock driver 74. The input buffers 56, 60 and clock driver 74, for example, can be modeled by simply including "dummy" buffers and drivers in the delay model circuit 62. But it is generally not practical to include an entire clock tree in the delay model circuit 62. Moreover, propagation delays can be different in different branches of the clock tree 78, and the propagation delay in even a single branch of the clock tree 78 can vary as a function of time and temperature, for example. With the continued increases in clock speed needed to increase the operating speed of integrated circuit devices, these variations in the propagation delays in the clock tree 78 can prevent the proper operation of integrated circuit devices.

There is therefore a need for a suitable system and method for compensating for clock signal skew as internal clock signals are coupled to various circuits through a clock tree.

SUMMARY OF THE INVENTION

A clock skew compensation circuit according to the present invention includes a synchronized mirror delay or clock synchronized delay having a measurement delay line and a variable delay line. A clock signal is coupled to the variable delay line of the synchronized mirror delay, optionally through a buffer that may delay the clock signal by a first delay value. A clock tree is coupled to an output terminal of the synchronized mirror delay. The clock tree generates a feedback signal that is coupled to an input terminal of the measurement delay line input terminal. The feedback signal corresponds to the propagation delay of the clock signal being coupled through the clock tree. The clock signal coupled through the clock tree may be used to capture a digital signal in a suitable circuit, such as a latch.

DETAILED DESCRIPTION OF THE INVENTION

Figure 1:
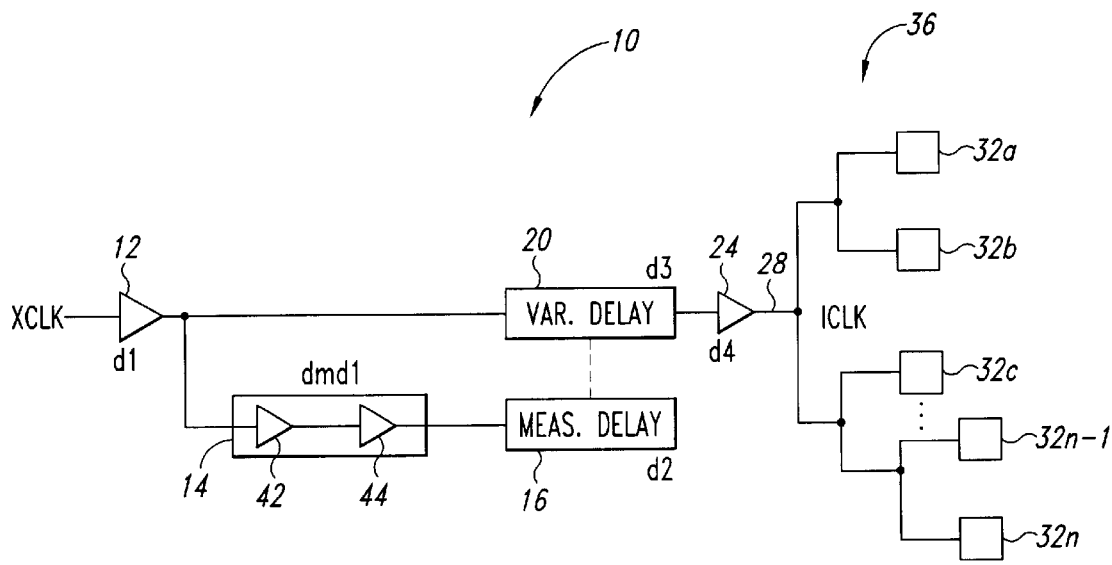
FIG. 1 is a block diagram of a conventional synchronized mirror delay circuit that can be used to compensation for some clock signal skew in integrated circuit devices.
Figure 2:
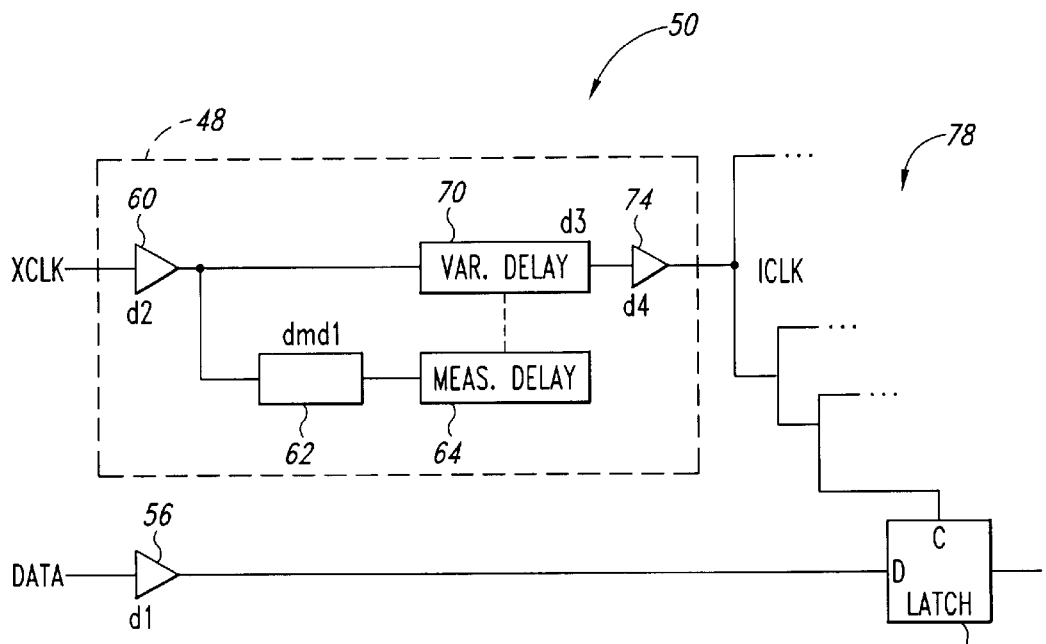
FIG. 2 is a block diagram of a conventional clock skew compensation circuit using a synchronized mirror delay circuit.
Figure 3:
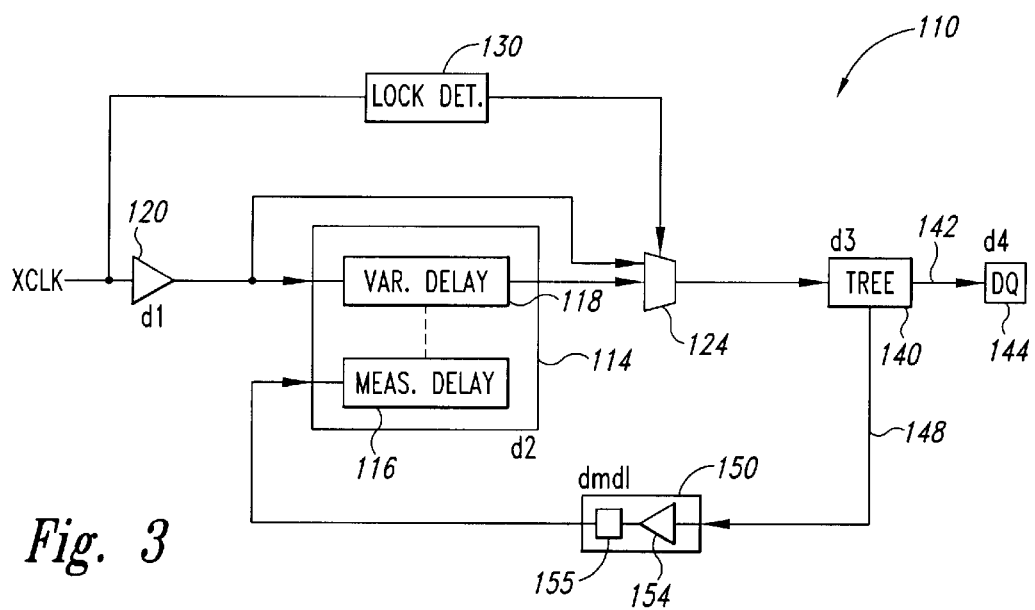
FIG. 3 is a block diagram of a clock skew compensation circuit according to one embodiment of the invention.

A clock skew compensation circuit 110 according to one embodiment of the invention is shown in FIG. 3. The compensation circuit 110 includes an SMD/CSD circuit 114 having a measurement delay line 116 and a variable delay line 118 that operate in the same manner as the SMD/CSD circuits described with reference to FIGS. 1 and 2. An external clock signal XCLK is applied to the SMD/CSD circuit 114 through an input buffer 120 that introduces a delay of $d_1$. Each of the delay lines 116, 118 in the SMD/CSD circuit 114 introduces a delay of $d_2$. The output of the SMD/CSD circuit 114 is applied to one input of a multiplexer 124 that is controlled by a lock detector 130. The lock detector 130 causes the multiplexer 124 to initially couple the output of the input buffer 120 to a clock tree 140, which, in turn, is coupled to an internal data or "DQ" path 144. Once the measurement delay line 116 has set the proper delay of the variable delay line 118, the lock detector 130 causes the multiplexer 124 to couple the output of the SMD/CSD circuit 114 to a latch (not shown) in the tree 140, which, in turn, strobes data through a signal line 142 and through the DQ path 144. As previously mentioned, it requires only two periods of the external clock XCLK signal for the proper delay of the variable delay line 118 to be set. Thus, the lock detector 130 can be implemented by a conventional circuit that simply counts two clock pulses and then generates a signal to switch the multiplexer 124.

Unlike the clock skew compensation circuits 50 shown in FIG. 2, the clock skew compensation circuit 110 does not use any circuit to model the delay of the clock tree 140. Instead, the delay of the clock tree is determined from the clock tree 140 itself. More specifically, a feedback signal from a chosen node of the clock tree 140 is coupled through a line 148 to the input of the measurement delay line 116 through a delay model circuit 150. However, the delay model circuit 150 does not model the delay of the clock tree 140. Instead, the delay model circuit 150 models only the delay $d_1$ of the input buffer 120 and the DQ path 144. As previously explained, it is substantially easier to model a clock driver or a single data path than it is to model a clock tree. In the clock skew compensation circuit 110, the delay model circuit 150 is implemented by a "dummy" input buffer 154, which is identical to the input buffer 120, and an additional delay circuit 155, which provides a delay corresponding to the delay of the DQ path.

The delay of the clock tree 140 from the output of the SMD/CSD circuit 114 to the chosen node can be designated as $d_3$. Since the feedback signal coupled to the input of the delay model circuit 150 corresponds to the delay of the clock tree 140, the signal applied to the input of the measurement delay line 116 corresponds to the delay of the input buffer 120 plus the delay of the clock tree 140. The signal applied to the measurement delay line 116 thus replicates the signals that the delay model circuits provide to the measurement delay lines in the clock skew compensation circuits 50 shown in FIG. 2.

The equations explaining the operation of the clock skew compensation circuit 110 are as explained below with the assumption that n=1 and $d_{mdl}$<tCLK. As previously mentioned, $d_1$ is the delay of the input buffer 120, $d_2$ is the delay of the delay of the SMD/CSD circuit 114, $d_3$ is the delay of the clock tree 140 to the node where the feedback signal is taken, and $d_4$ is the delay of the DQ path 144: The delay $d_2$ of the SMD/CSD circuit 114 is given by the equation $d_2$=tCLK$-d_1-d_3-d_4$. Substituting this equation in the earlier equation provides: $d_1$+[tCLK$-d_1-d_3-d_4$]+$d_3$+$d_3$, which may be expanded to $d_1$+tCLK$-d_1-d_3-d_4$+$d_3$+$d_4$, which can be simplified to tCLK, or one period of the external clock signal XCLK. The total time to achieve lock is given by the formula $d_1$+$d_3$+$d_{mdl}$+(tCLK$-d_3-d_{mdl}$)+ (tCLK$-d_3-d_{mdl}$)+$d_3$+$d_4$, which can be reduced to $d_1$+2tCLK$-d_{mdl}$+$d_4$. Using the formula $d_{mdl}$=$d_1$+$d_4$, the formula for calculating the total time to achieve lock can be reduced to simply 2tCLK.

Figure 4:
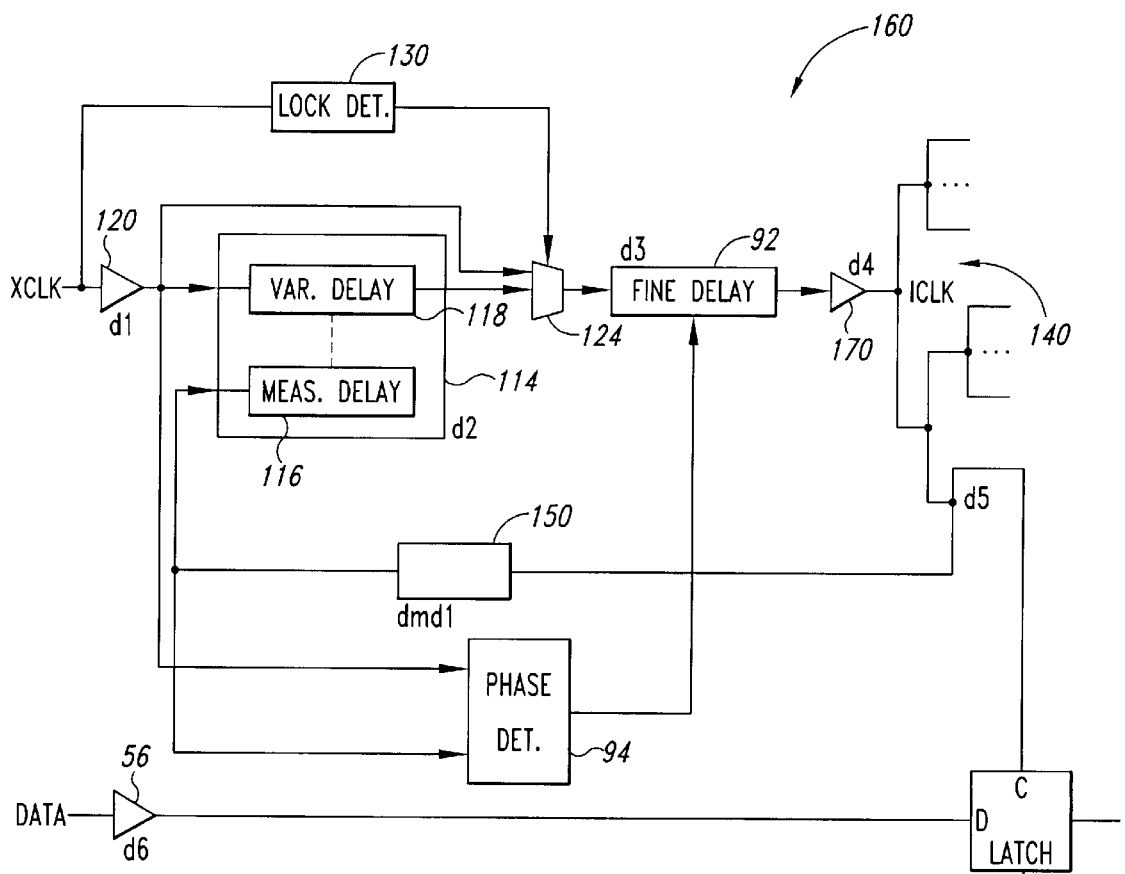
FIG. 4 is a block diagram of a clock skew compensation circuit according to another embodiment of the invention.

The delay lines 116, 118 used in the clock skew compensation circuit 110 of FIG. 3 may be implemented with series coupled logic circuits, such as inverters (not shown). In such case, the resolution of the delay lines 116, 118, i.e., the minimum delay increments, will be limited to the approximately 200 ps delay time of two logic gates. With time interpolation, the resolution will be improved to a fraction of the two logic gate delay, such as about 50 ps. To allow the delay lines 116, 118 to interpolate the delay time of each logic circuit, a clock skew compensation circuit 160 as shown in FIG. 4 may be used. The circuit 160 uses many of the same components used in the clock skew compensation circuit 110 of FIG. 3. In the interest of brevity, these components have been provided with the same reference numerals, and an explanation of their structure and operation will not be repeated. The clock skew compensation circuit 160 includes a DLL used to interpolate in fine increments within the minimum resolution of the delay lines 116, 118. The DLL includes a fine delay line 92 that can alter the delay of the clock signal applied to the clock tree in fine increments. The fine delay is incremented or decremented under control of an UP/DOWN signal generated by a phase detector 94. The phase detector 94 compares the phase of the clock signal at the output of the input buffer 120 with the phase of the feedback clock signal from a predetermined node of the clock tree 140. The compensation circuit 160 also differs from the compensation circuit 110 of FIG. 3 by the inclusion of a clock driver 170 for applying the internal clock ICLK signal to the clock tree 140. Also, the compensation circuit 160 includes a latch 52 that uses the ICLK signal to capture an external DATA signal.

The following equation explain the operation of the clock skew compensation circuit 160, in which $d_1$ is the delay of the input buffer 120, $d_2$ is the delay of the SMD/CSD circuit 114, $d_3$ is the delay of the fine delay circuit 92, $d_4$ is the delay of the clock driver 170, $d_5$ is the delay of the clock tree 140 to the node where the feedback signal is taken, and $d_6$ is the delay of the data driver circuit 56. In order to balance the load of each output of the clock tree 140, the feedback signal is coupled from the tree 140 through a signal line that is independent from, but has the same electrical length as, the signal lines used to couple the clock signal to other circuits, such as to the clock input of the latch 52. The total delay from the external clock terminal where the external clock signal XCLK is applied to the clock input of the latch 52 is given by the formula: $d_1$+$d_2$+$d_3$+$d_4$+$d_5$, where $d_{mdl}$=$d_1$-$d_6$. The delay $d_2$ of each delay line 116, 118 in the SMD/CSD circuit 114 is given by the equation $d_2$=tCLK$-d_{mdl}-d_3-d_4-d_5$. Substituting the equations for $d_{mdl}$ and for $d_2$ in the total delay equation yields: $d_1$+[tCLK$-d_1+d_6-d_3-d_4-d_5$]+$d_3$+$d_4$+$d_5$, which can be simplified to tCLK+$d_6$. The ICLK signal will thus be applied to the latch 52 one clock period after the DATA signal is applied to the latch 52. The time to achieve lock can be calculated using the procedure describe above as: $d_1$+$d_6$+2[tCLK$-d_{mdl}-d_3-d_4-d_5$]+[$d_{mdl}$+$d_3$+$d_4$+$d_5$]+$d_3$+$d_4$+$d_5$, which can be reduced to 2tCLK+$d_6$.

Alternatively, rather than include the negative delay $d_6$ of the data input buffer 56 in the delay model circuit 150, an additional input buffer (not shown) like the buffer 56 can be added between the input buffer 120 and the variable delay line 118.

Figure 5:
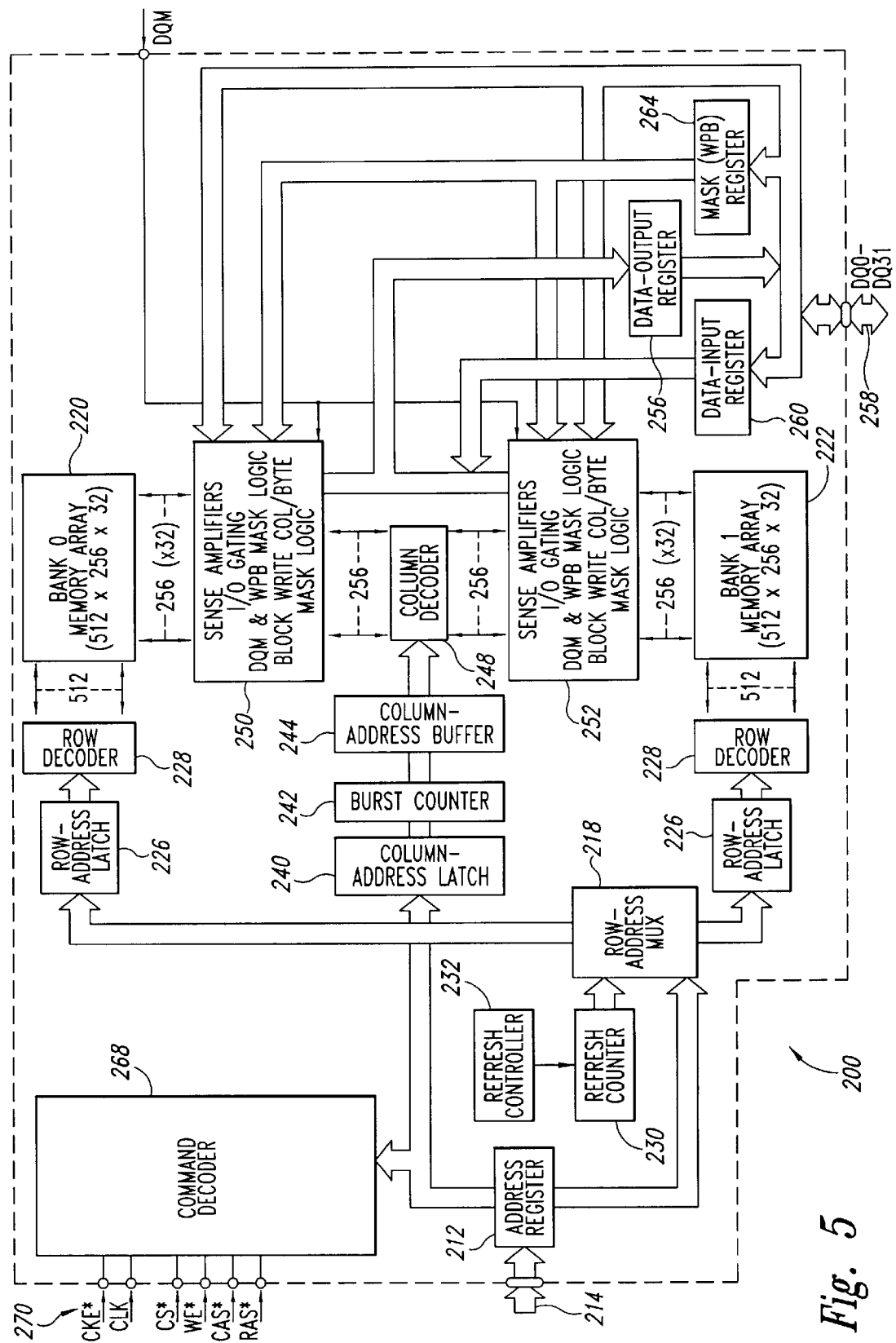
FIG. 5 is a block diagram of a memory device using a clock skew compensation circuit in accordance with an embodiment of the invention.

The clock skew compensation circuit 160 can be used to latch commands or addresses into and data into and out of a variety of memory devices, including the memory device shown in FIG. 5. The memory device illustrated therein is a synchronous dynamic random access memory ("SDRAM") 200, although the invention can be embodied in other types of synchronous DRAMs, such as packetized DRAMs and RAMBUS DRAMs (RDRAMS"), as well as other types of synchronous devices. The SDRAM 200 includes an address register 212 that receives either a row address or a column address on an address bus 214. The address bus 214 is generally coupled to a memory controller (not shown in FIG. 5). Typically, a row address is initially received by the address register 212 and applied to a row address multiplexer 218. The row address multiplexer 218 couples the row address to a number of components associated with either of two memory banks 220, 222 depending upon the state of a bank address bit forming part of the row address. Associated with each of the memory banks 220, 222 is a respective row address latch 226, which stores the row address, and a row decoder 228, which applies various signals to its respective array 220 or 222 as a function of the stored row address. The row address multiplexer 218 also couples row addresses to the row address latches 226 for the purpose of refreshing the memory cells in the arrays 220, 222. The row addresses are generated for refresh purposes by a refresh counter 230, which is controlled by a refresh controller 232.

After the row address has been applied to the address register 212 and stored in one of the row address latches 226, a column address is applied to the address register 212. The address register 212 couples the column address to a column address latch 240. Depending on the operating mode of the SDRAM 200, the column address is either coupled through a burst counter 242 to a column address buffer 244, or to the burst counter 242 which applies a sequence of column addresses to the column address buffer 244 starting at the column address output by the address register 212. In either case, the column address buffer 244 applies a column address to a column decoder 248 which applies various signals to respective sense amplifiers and associated column circuitry 250, 252 for the respective arrays 220, 222.

Data to be read from one of the arrays 220, 222 is coupled to the column circuitry 250, 252 for one of the arrays 220, 222, respectively. The data is then coupled through a read data path to a data output register 256, which applies the data to a data bus 258. Data to be written to one of the arrays 220, 222 is coupled from the data bus 258 through a data input register 260 and a write data path to the column circuitry 250, 252 where it is transferred to one of the arrays 220, 222, respectively. A mask register 264 may be used to selectively alter the flow of data into and out of the column circuitry 250, 252, such as by selectively masking data to be read from the arrays 220, 222.

The above-described operation of the SDRAM 200 is controlled by a command decoder 268 responsive to command signals received on a control bus 270. These high level command signals, which are typically generated by a memory controller (not shown in FIG. 5), are a clock enable signal CKE*, a clock signal CLK, a chip select signal CS*, a write enable signal WE*, a row address strobe signal RAS*, and a column address strobe signal CAS*, which the "*" designating the signal as active low. Various combinations of these signals are registered as respective commands, such as a read command or a write command. The command decoder 268 generates a sequence of control signals responsive to the command signals to carry out the function (e.g., a read or a write) designated by each of the command signals. These command signals, and the manner in which they accomplish their respective functions, are conventional. Therefore, in the interest of brevity, a further explanation of these control signals will be omitted. The CLK signal, shown in FIGS. 3 and 4 as the external clock signal XCLK, is preferably coupled through a clock skew compensation circuit in accordance with the invention, such as the clock skew compensation circuits 110, 160 shown in FIGS. 3 and 4, respectively. The compensation circuits 110, 160 can then be used to generate an internal clock signal ICLK that latches addresses from the address bus 214, latches data from the data bus 258, or latched data onto the data bus 258, as previously explained.

Figure 6:
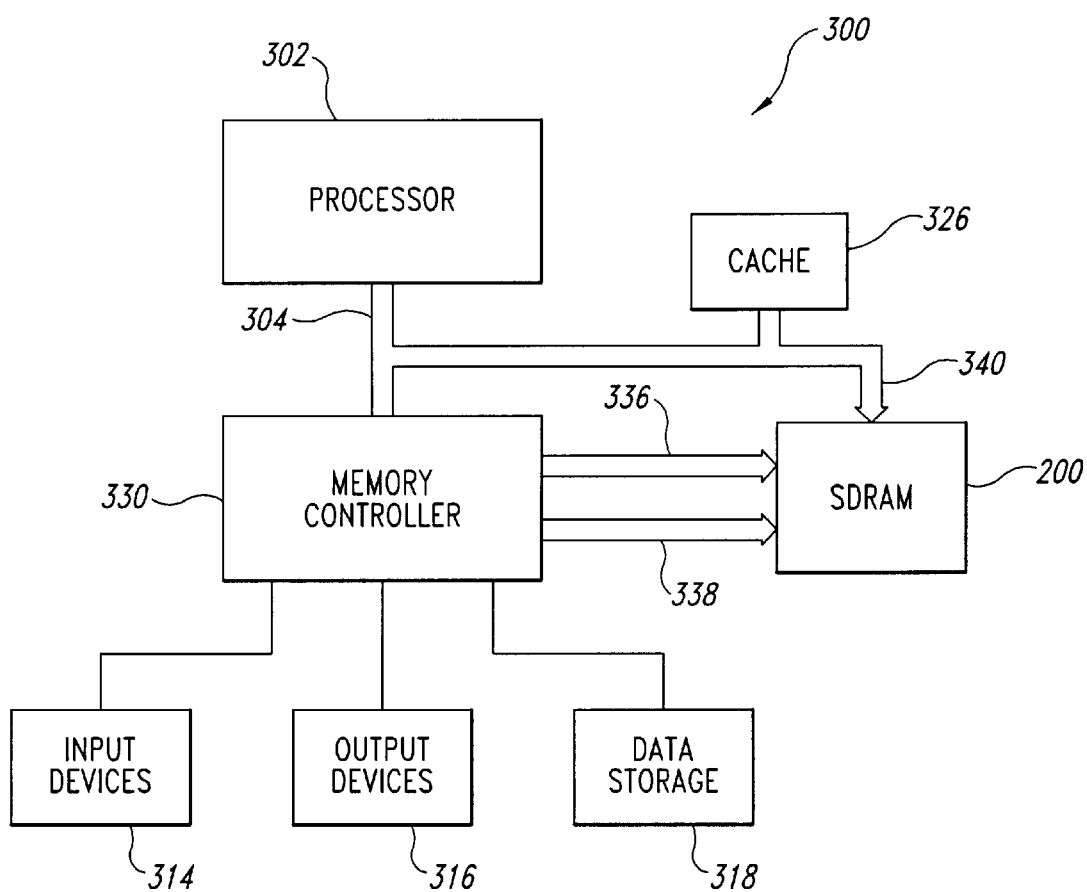
FIG. 6 is a block diagram of a computer system using the memory device of FIG. 5.

FIG. 6 shows a computer system 300 containing the SDRAM 200 of FIG. 5. The computer system 300 includes a processor 302 for performing various computing functions, such as executing specific software to perform specific calculations or tasks. The processor 302 includes a processor bus 304 that normally includes an address bus, a control bus, and a data bus. In addition, the computer system 300 includes one or more input devices 314, such as a keyboard or a mouse, coupled to the processor 302 to allow an operator to interface with the computer system 300. Typically, the computer system 300 also includes one or more output devices 316 coupled to the processor 302, such output devices typically being a printer or a video terminal. One or more data storage devices 318 are also typically coupled to the processor 302 to allow the processor 302 to store data in or retrieve data from internal or external storage media (not shown). Examples of typical storage devices 318 include hard and floppy disks, tape cassettes, and compact disk read-only memories (CD-ROMs). The processor 302 is also typically coupled to cache memory 326, which is usually static random access memory ("SRAM"), and to the SDRAM 200 through a memory controller 330. The memory controller 330 normally includes a control bus 336 and an address bus 338 that are coupled to the SDRAM 200. A data bus 340 is coupled from the SDRAM 200 to the processor bus 304 either directly (as shown), through the memory controller 330, or by some other means.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A clock skew compensation circuit, comprising:

a synchronized mirror delay having an output terminal, a measurement delay line input terminal, and a variable delay line input terminal;

an input buffer having an input terminal coupled to receive an external clock signal and an output terminal coupled to the variable delay line input terminal of the synchronized mirror delay; and a clock tree coupled to the output terminal of the synchronized mirror delay, the clock tree having a feedback node, the feedback node being coupled to the measurement delay line input terminal to provide a delayed feedback signal corresponding to a signal coupled from the feedback node of the clock tree.

2. The clock skew compensation circuit of claim 1 wherein the input buffer delays the external clock signal by a first delay value; and wherein the clock skew compensation circuit further comprises a model delay circuit coupled between the feedback node of the clock tree and the measurement delay line input terminal, the model delay circuit providing a delay substantially equal to the first delay value so that the delayed feedback signal applied to the measurement delay line input terminal corresponds to the signal from the feedback node of the clock tree delayed by substantially the first delay value.

3. The clock skew compensation circuit of claim 2 further comprising:

a clock driver coupling the output of the synchronized mirror delay to the clock tree, the clock driver providing a delay of a second delay value, and wherein the model delay circuit further provides a delay substantially equal to the second delay value so that the delayed feedback signal applied to the measurement delay line input terminal corresponds to the signal from the feedback node of the clock tree delayed by substantially the sum of the first delay value and the second delay value.

4. The clock skew compensation circuit of claim 1 further comprising:

a switch having a first input terminal coupled to receive the external clock signal, a second input terminal coupled to the output terminal of the synchronized mirror delay, an output terminal coupled to the clock tree and a control terminal for coupling the output terminal to the first input terminal responsive to a control signal applied to the control terminal having a first state and coupling the output terminal to the second input terminal responsive to the control signal having a second state; and a detector coupled to the control input of the switch and being operable to determine when the synchronized mirror delay has stabilized, the detector being operable to generate the control signal having the first state prior to determining the synchronized mirror delay has stabilized and to generate the control signal having the second state responsive to determining the synchronized mirror delay has stabilized.

5. The clock skew compensation circuit of claim 4 wherein the detector comprises a logic circuit that is operable to generate the control signal having the first state prior to the lapse of a predetermined number of periods of the external clock signal, and is operable to generate the control signal having the second state responsive to the lapse of the predetermined number of periods of the external clock signal.

6. The clock skew compensation circuit of claim 5 wherein the predetermined number of periods of the external clock signal is two periods of the external clock signal.

7. The clock skew compensation circuit of claim 1 further comprising:

a fine delay line coupled between the output of the synchronized mirror delay and the clock tree, the fine delay line varying the delay of the fine delay line responsive to a delay control signal applied to a control terminal of the fine delay line;

a phase detector having a first input terminal to an output terminal of the fine delay line, a second input terminal, and an output terminal coupled to the control terminal of the fine delay line, the phase detector generating the delay control signal as a function of the phase difference between signal applied to its first and second input terminals; and a delay model circuit operable to provide a predetermined delay, the delay model circuit coupling the delayed feedback signal from the clock tree to the second input terminal of the phase detector.

8. The clock skew compensation circuit of claim 7 wherein the delay model circuit comprises a delay circuit having a delay with a delay magnitude that is substantially less than the delay of the synchronized mirror delay.

\* \* \* \* \*

UNITED STATES PATENT AND TRADEMARK OFFICE
CERTIFICATE OF CORRECTION

PATENT NO.      : 6,618,283 B2
DATED           : September 9, 2003
INVENTOR(S)     : Feng Lin It is certified that error appears in the above-identified patent and that said Letters Patent is hereby corrected as shown below:

Title page,
Item [56], References Cited, U.S. PATENT DOCUMENTS, reads "Omitted References" should read -- 5,870,445 A    2/1999    Farwell ….. 375/371
5,994,934 A    11/1999    Yoshimura et al. ….. 327/158
6,476,594 B1    11/2002    Roisen ….. 324/76.54 --

Column 1,
Line 42, reads "clock skew problems." should read -- clock skew problem. --

Column 2,
Line 9, reads "compliment." should read -- complement. --

Column 3,
Line 41, reads "the variable variable delay" should read -- the variable delay --
Line 62, reads "clock periods" should read -- clock period --

Column 4,
Line 6, reads "compensation circuits" should read -- compensation circuit --
Line 49, reads "to compensation for" should read -- to compensate for --

Column 5,
Line 60, reads "DQ path 144: The" should read -- DQ path 144. The --

Column 6,
Line 36, reads "equation explain" should read -- equation explains --
Line 58, reads "procedure describe above" should read -- procedure described above --

Column 7,
Line 6, reads "(RDRAMS")," should read -- ("RDRAMS"), --
Line 60, reads "which the" should read -- with the --

Column 8,
Line 11, reads "latched data onto" should read -- latches data onto --

UNITED STATES PATENT AND TRADEMARK OFFICE
CERTIFICATE OF CORRECTION

| | |
|---|---|
| PATENT NO. | : 6,618,283 B2 |
| DATED | : September 9, 2003 |
| INVENTOR(S) | : Feng Lin |

It is certified that error appears in the above-identified patent and that said Letters Patent is hereby corrected as shown below:

Column 10,
Line 26, reads "between signal applied" should read -- between the signal applied --

Signed and Sealed this

Twentieth Day of July, 2004

JON W. DUDAS
*Acting Director of the United States Patent and Trademark Office*